(12) United States Patent
Stumm et al.

(10) Patent No.: US 9,090,114 B1
(45) Date of Patent: Jul. 28, 2015

(54) MACHINE INCLUDING LED-BASED UV RADIATION SOURCES TO PROCESS COATINGS

(76) Inventors: Brian A Stumm, Spokane, WA (US); Eric Sari, Chattaroy, WA (US)

( * ) Notice: Subject to any disclaimer, the term of this patent is extended or adjusted under 35 U.S.C. 154(b) by 1007 days.

(21) Appl. No.: 12/877,231

(22) Filed: Sep. 8, 2010

(51) Int. Cl.
*A61N 5/00* (2006.01)
*B41M 7/00* (2006.01)

(52) U.S. Cl.
CPC .................................. *B41M 7/0045* (2013.01)

(58) Field of Classification Search
CPC ........................... H01L 27/153; H05B 33/0803
USPC ............. 250/492.1, 492.2, 492.3, 365, 461.1, 250/453.11, 454.11; 118/667, 641
See application file for complete search history.

(56) References Cited

U.S. PATENT DOCUMENTS

| | | | | |
|---|---|---|---|---|
| 4,665,627 A * | 5/1987 | Wilde et al. | | 34/278 |
| 5,633,049 A * | 5/1997 | Bilkadi et al. | | 427/487 |
| 2002/0033134 A1* | 3/2002 | Fannon | | 118/667 |
| 2003/0042633 A1* | 3/2003 | Foreman et al. | | 264/1.36 |
| 2005/0154075 A1* | 7/2005 | Siegel | | 522/8 |
| 2007/0184141 A1* | 8/2007 | Custer | | 425/174 |
| 2008/0032491 A1* | 2/2008 | Herchen | | 438/476 |
| 2008/0055521 A1* | 3/2008 | Mizutani et al. | | 349/96 |
| 2009/0106999 A1* | 4/2009 | Swoboda | | 34/105 |
| 2009/0126628 A1* | 5/2009 | Brendel | | 118/708 |
| 2009/0318591 A1* | 12/2009 | Ageishi et al. | | 524/88 |
| 2010/0028201 A1* | 2/2010 | Neister | | 422/24 |
| 2010/0177519 A1* | 7/2010 | Schlitz | | 362/294 |
| 2011/0027453 A1* | 2/2011 | Boock et al. | | 427/2.12 |
| 2011/0114260 A1* | 5/2011 | Sjong | | 156/344 |
| 2011/0261443 A1* | 10/2011 | Isojima et al. | | 359/360 |

* cited by examiner

*Primary Examiner* — Jack Berman
*Assistant Examiner* — Jason McCormack
(74) *Attorney, Agent, or Firm* — Brian J. Pangrle

(57) ABSTRACT

A machine includes a conveyor configured to receive and convey a circuit assembly treated with a UV curable coating material; a UV zone that includes one or more LED-based UV radiation sources; a heating zone; and a controller configured to control heating of a circuit assembly treated with a UV curable coating material in the heating zone to achieve a target temperature of the treated electronic assembly prior to the UV zone. Various other apparatuses, systems, methods, etc., are also disclosed.

19 Claims, 8 Drawing Sheets

MACHINE INCLUDING LED-BASED UV RADIATION SOURCES TO PROCESS COATINGS

TECHNICAL FIELD

Subject matter disclosed herein generally relates to equipment and techniques to process coatings.

BACKGROUND

Conventional machines to process UV curable coatings rely on high-energy lamps. Such lamps may have electrodes or be electrodeless. For example, a conventional microwave-powered electrodeless lamp, packaged in a compact 6-inch modular unit, consumes 1800 W for generation of ultraviolet (UV) radiation. Such high-energy lamps typically generate intense and harmful UV radiation as well as significant amounts of heat. Significant amounts of infrared (IR) energy generated by such lamps can be difficult to control and detrimental to coated substrates (e.g., electrical components, etc.). As described herein, in various examples, a machine can process UV curable or other coatings without requiring a conventional high-energy lamp.

BRIEF DESCRIPTION OF THE DRAWINGS

Features and advantages of the described implementations can be more readily understood by reference to the following description taken in conjunction with the accompanying drawings.

DETAILED DESCRIPTION

Figure 1:
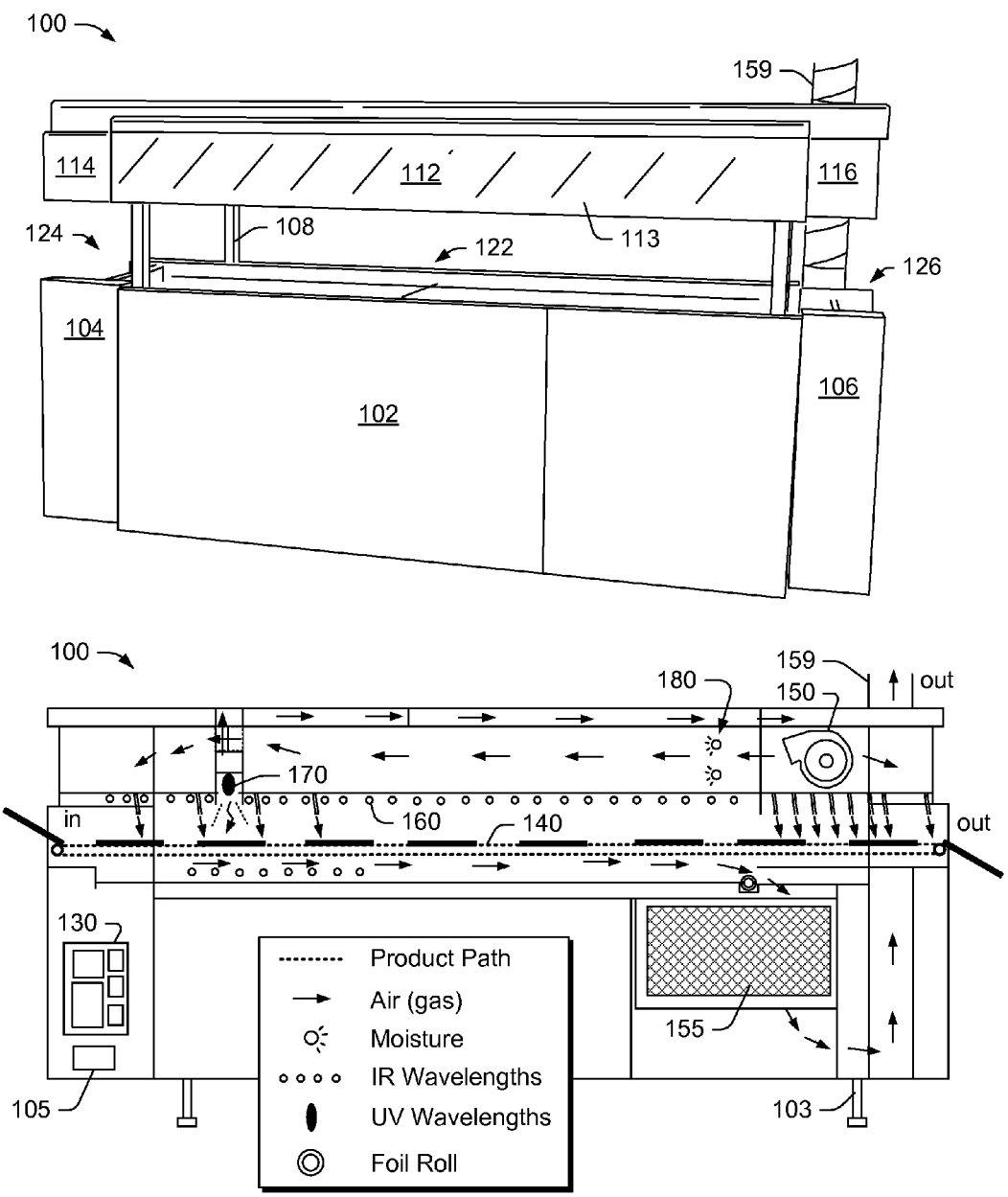
FIG. 1 is a perspective view of an example of a machine to process coatings and a schematic diagram that illustrates various features of such a machine.

The following description includes the best mode presently contemplated for practicing the described implementations. This description is not to be taken in a limiting sense, but rather is made merely for the purpose of describing general principles of the implementations. The scope of the described implementations should be ascertained with reference to the issued claims.

Many types of devices benefit from being coated, typically with a thin layer of material. In general, a coating is a covering that is applied to the surface of an object, often referred to as a substrate. Coatings may be applied as liquids, gases or solids. In many cases coatings are applied to improve surface properties of a substrate, such as appearance, adhesion, wettability, corrosion resistance, wear resistance, and scratch resistance. In other cases, in particular in printing processes and semiconductor device fabrication, a coating often forms an integral part of a finished product.

A particular type of coating, referred to as conformal coating, aims to protect by providing a non-conductive dielectric layer, for example, as applied to a printed circuit board assembly (PCBA) to protect components of the PCBA from damage due to any of a variety of factors (e.g., contamination, moisture, debris, or corrosion due to environmental factors). For PCBAs, conformal coating usually occurs at the end of an assembly process as conformal coating may be seen as messy, hazardous, time consuming, inconvenient and costly.

Commonly used conformal coatings include silicone, epoxy, acrylic, urethane and poly(p-xylylene) polymers (e.g., Parylene™). Chemical and physical properties of such materials differ and may offer different degrees of protection. Some characteristics of coating materials are described below.

Acrylic coatings are typically solvent based and usually low cost, tough, hard, and transparent. Acrylic coatings often exhibit low moisture absorption and have short drying times. However, some acrylic coatings do not demonstrate resistance to either abrasion or chemicals especially petroleum solvents and alcohol. Common acrylic coatings can withstand greater than 1500 volts and a temperature range of about −59 C to 132 C.

Urethane coatings are typically hard and durable and have resistance to solvents. Urethane coating may shrink during curing and associated film stress may stress one or more coated components. Urethane coatings take care in application and can be difficult to remove. Temperature range tends to be akin to acrylic coatings.

For coating a PCBA, the PCBA is typically cleaned prior to coating. Common methods of coating include spraying, brushing or dipping. Steps of a spray coating process may include: PCBA cleaning; PCBA masking; PCBA spraying; curing of coating; and mask removal. Where masking is not required, the masking and mask removal may be omitted. In general, a coating process includes application of coating material to a PCBA and curing of applied coating material. Various types of coating equipment exist, which may rely on one or more atomizing nozzles, needle dispensers on a robotic platform, etc., for example, as manufactured by companies such as Specialty Coating Systems (Indianapolis, Ind.), PVA (Cohoes, N.Y.) and Nordson Asymtek (Carlsbad, Calif.).

Some types of urethanes, acrylates or mixtures thereof (e.g., acrylate urethanes) rely on exposure to UV radiation to initiate, accelerate or otherwise promote curing. An example of a UV curable coating is marketed as HumiSeal® UV40 (HumiSeal, Pittsburgh, Pa.). Such a coating is marketed as having greater adhesion to a wide range of commonly used solder resists; higher IR (insulation resistance) and MIR (moisture insulation resistance); resistance to a wider range of solvents; greater flexibility at a wide range of temperatures; not brittle at low temperatures; and reliable secondary (shadow area) moisture activated cure mechanism. Regarding moisture or humidity, sometimes its presence is attributed to a so-called "secondary" curing process where exposure to UV radiation is referred to as a "primary" curing process. While a HumiSeal® coating is mentioned, other coatings are available from companies such as DYMAX Corporation and Henkel AG & Co. (e.g., Hysol® and Stycast™). For example, Henkel AG & Co. markets coatings for a variety of flexible or rigid substrates that can be effectively dried or cured, purportedly, through heat or UV radiation.

Some UV primary curable materials offer secondary heat cure. Various equipment and techniques described herein, in trials, cured DYMAX® Multi-Cure® 6-621 UV/heat cure coating material and DYMAX® 9481 UV/moisture cure coating material with acceptable tack free results. DYMAX Corporation data includes depth of cure versus time for different UV intensities over UV-A range (e.g., 320 nm to 395 nm). Intensities mentioned by DYMAX Corporation span a range from 50 mW/cm$^2$ to 10 W/cm$^2$.

As to the Multi-Cure® 6-621 coating material, a DYMAX Corporation product data sheet states that light curing must occur prior to heat cure. As described herein, a process can include passing a substrate coated with a UV primary cure and heat secondary cure coating material through a heat zone prior to passing the substrate through a UV zone. Such a process can further include passing the substrate through one or more additional heat zones after the UV zone. In some instances, heating of a substrate may occur in a UV zone, optionally where UV equipment provides for at least some heat energy in a controllable manner (e.g., consider adjustable clearance/height UV sources).

As to the 9481 coating material, a DYMAX Corporation product data sheet states that moisture may be used as a secondary cure mechanism for shadowed areas that cannot be cured with light, that light cure is recommended prior to moisture cure and that exposure to heat (typically 65 C to 80 C) and higher relative humidity will accelerate cure. As described herein, a process can include passing a substrate coated with a UV primary cure and moisture secondary cure coating material through a heat zone prior to passing the substrate through one or more additional zones, which may include zones with controlled or added moisture (e.g., controlled relative humidity (RH) or increased RH with respect to ambient air). In some instances, heating of a substrate may occur in a UV zone, optionally where UV equipment provides for at least some heat energy in a controllable manner (e.g., consider adjustable clearance/height UV sources).

In various examples, techniques to reduce oxygen may be employed as oxygen has been known to inhibit surface cure of a coating material. Such techniques may include use of an inert gas such as nitrogen, filtration/separation/reaction of air components, etc. Such techniques may include a machine with one or more gas jets to direct oxygen free or oxygen reduced gas to a surface of a coating.

Various examples herein refer, at times, to a circuit assembly, which may be a PCBA or other assembly that includes one or more electronic circuits. In various manufacturing processes, one or more electronic components are attached to a PCB to form a functional printed circuit assembly (e.g., PCA or PCBA). In through-hole construction, component leads may be inserted in holes of a PCB. In surface-mount construction, components may be placed on pads or lands on an outer surface of a PCB. In such types of construction, as appropriate, component leads may be electrically and often mechanically fixed to a board with a molten metal solder.

In general, a coating or coatings can help protect printed circuit boards and electronic components from thermal cycling and adverse environmental conditions. As described herein, a coating (or coatings) may be applied to any of a variety of types of products that may include circuitry or that may be intended for use with circuitry. A coating may be essentially solvent-free or low in VOC. While a coating, when hardened may contribute to some component stress, a coating can enhance mechanical strength, offer electrical insulation, and protect against vibration and shock.

A UV curable coating typically includes the following constituents: oligomers, monomers and catalysts. A coating may also include various additives, which may provide characteristics beneficial for a certain type of application. UV curable coatings typically have relatively short cure times that benefit those seeking quick turnaround and shipment of PCBAs. A machine for processing coatings often includes a conveyor configured to receive PCBAs and to convey PCBAs with a linear speed of, for example, about 5 to 10 feet per minute. Such a machine may be configured and operated to process about 250 PCBAs per hour. In general, the more PCBAs that can be coated in a given period of time, the greater the opportunity to operate a facility at full capacity, which, in turn, can optimize efficiency and keep costs competitive.

In a particular trial, a machine as described herein processed PCBAs coated with a DYMAX® coating material where the machine was operated with a conveyor speed of about 75 cm/min (2.5 feet/min), which would provide an output of about 160 PCBs per hour (e.g., a PCB having length and width dimensions of about 10 in by 10 in and space between boards of about 1 in).

For so-called UV curable coatings, as described herein, factors such as temperature, humidity or temperature and humidity can be quite relevant. As described herein, a machine for processing coatings may be configured with one or more UV assemblies in conjunction with a temperature control assembly, a humidity assembly or a temperature control assembly and a humidity control assembly.

FIG. 1 shows an example of a machine 100 to process coatings. The machine 100 includes a base 102 with a product input end 104 and a product output end 106. A conveyor 122 extends along an axial length of the machine 100 between a product input end 124 and a product output end 126. A plurality of posts 108 support a top or cover 112 configured to cover product conveyed by the conveyor 122. In the example of FIG. 1, the cover 112 is fitted with one or more filters 113 as gas may be drawn into the machine 100 via one or more gas inlets of the top 112.

In a schematic view of FIG. 1, various features of the machine 100 are shown, some of which may be optional. The schematic view shows a product path (e.g., as defined by a conveyor path 140), an air or gas path associated with a mover 150 (see, e.g., straight arrows), heat sources 160, radiation sources that emit at least some UV radiation 170, and moisture sources 180. Also shown are base supports 103, a power source 105 (e.g., a power connector, converter, regulator, etc.), a controller 130, a filter 155 (e.g., carbon-based filter or other) and a foil roll (e.g., to provide foil to collect any debris such as board coating drips). A main gas flow path includes an intake near the radiation sources 170, a transverse flow path to the mover 150, and a reverse transverse flow path. Gas may be directed toward the product path via a series of vents or gas knives. Gas may enter the machine 100 at or near a product path inlet and may exit the machine 100 at or near a product path outlet. Where gas is directed via the vents or gas knives, at least some of the gas passes through a filter space configured to receive the filter 155 and continues to an exhaust pipe 159, which may be optionally fitted with one or more exhaust sensors or controllers.

The product path (e.g., as defined by the conveyor path 140) may be segmented into zones. In the example of FIG. 1, the product path includes a radiation zone associated with the radiation sources 170. As shown, a heating zone exists prior to the radiation zone 170 where the heating zone includes one or more heat sources 160. A cooling zone may exist proximate to the outlet 126 where gas in this zone may be relatively free of solvent or other material and may exit the machine 100 without passing through the filter 155 or the exhaust pipe 159. In general, a product path includes multiple zones. Such zones may include one or more gas convection zones, one or more IR radiation zones, one or more UV radiation zones, etc. A zone may optionally provide for multiple types of processing (e.g., IR and UV, UV and gas convection, UV and visible radiation, etc.). A product path may be configured to optimize a particular coating process. While radiative and convective heat transfer are mentioned, a process may include conductive heat transfer (e.g., consider contact between a board and a conveyor component).

The machine 100 may be configured to emit radiation in various wavelengths (e.g., UV, visible, IR). In general, solvent-based coatings involve evaporation of solvent, for example, via heating. Some silicone-based coatings rely on heat. The machine 100 may achieve heating primarily via medium to long wave IR which can reduce likelihood of entrapment of off-gassed materials (such as solvent) which could later cause bubbles that may pop and blister (e.g., unacceptable product characteristics). The machine 100 may provide for some convection heating and typically provides for convection cooling (e.g., in a cooling zone). Accordingly, as described herein, an assembly of a processing machine can be configured to emit radiation in a combination of UV, visible (VIS) and IR wavelengths. In various trials, a combination of such UV/VIS/IR wavelengths cured DYMAX® coatings without a need for a mercury-based radiation source. Mercury-based UV lamps emit significant amounts of IR and visible wavelength energy in a relatively uncontrolled manner. Flex circuits can melt under uncontrollable, high intensity heat and IR emissions of a conventional UV emitter (e.g., consider lamp-based systems). As described herein, the machine 100 can offer closed loop control of radiation (e.g., one or more of UV, VIS and IR). Such control can enhance product quality and reduce operator and other risks as well as conserve energy compared to conventional high-energy lamp-based emission systems (e.g., mercury vapor lamps, xenon-mercury short arc lamps, etc.).

As described herein, a circuit assembly may be a flex circuit assembly (e.g., a "flex circuit"). Flex circuits are commonly used in cell phones, notebook computers, etc., and conventionally coated with coatings that do not require UV curing because of damage that could be caused by a conventional UV emitter (i.e., high temperature risk due to IR emissions). A manufacturing process for flex circuits typically includes mounting electronic devices on flexible plastic substrates, such as polyimide, polyetheretherketone, polyester, etc. Flex circuits are often coated with solvent-based coatings (e.g., volatile organic solvents), water-based or silicone-based (e.g., suitable for room temperature vulcanizing). A coating supplier may provide a schedule as to cure, for example, room temperature or heat accelerated cure (e.g., 2 hours at RT, 30 minutes at 60 C, etc.). As described herein, machines and methods that can essentially decouple heating and UV exposure optionally allow for processing of flex circuits coated with one or more UV curable coatings. For example, an approach that relies on LED-based UV sources can significantly reduce risk of heat damage as associated with exposure of a heat-sensitive flex circuit to a conventional mercury-based lamp UV source.

As described herein, a machine for processing coatings can include a heated process cavity with independently controlled convection/infrared (IR) heating modules. During operation, warm air can be impinged directly onto product being conveyed via air knives located in one or more zones (e.g., consider two heat zones that border a UV zone). The IR modules may be rapid response long wave IR heaters that act to dry coating material quickly without solvent entrapment. Such a machine may have optimized heating and cooling zone sizes to maximize throughput and minimize use of floor space. Such a machine may have supply air introduced via large area filters running along the length of the machine on both sides. A large squirrel cage blower may be used to draw air through the top and force the air down onto product to cool it in one or more zones adjacent or at the exit end of the machine. The same blower may be configured to provide fresh supply air to each of the heating zones through a plenum above a process cavity. Supply air may be delivered in a single pass airflow design providing the largest volume of air to one or more zones adjacent to or at the entrance of the machine where significant solvent off-gassing can occur. Contaminated air and volatiles, where present, can be down-draft exhausted from the machine, for example, via one or more openings located between a last heat zone and a first cooling zone. Such a machine may include traffic control communications monitors for monitoring passage of product into, through and out of the machine.

As described herein, gas flow (e.g., air or other gas) can increase uniformity of heating. For example, cooling air at sufficient velocity and flow rate can act to cool low thermal mass areas while radiation (e.g., IR radiation) acts to heat these low thermal mass areas. In such an example, a cooling mechanism and a heating mechanism can be tailored to provide enhanced temperature control. One or more sensors may provide information to a temperature control algorithm that can control cooling, heating or both cooling and heating. A control algorithm may optionally be a closed-loop control algorithm, for example, where energy to a heater (e.g., IR radiation unit), energy to a gas mover, and energy to a conveyor are controlled to achieve one or more temperatures or temperature profile over a product path.

Where multiple machines are used in series, machine to machine communication can coordinate passage of substrates (e.g., boards) from one machine to the next. A PCBA industry standard (SMEMA) includes signals to tell up-line machines readiness status and also signals to inform down-line machines that a board is coming. As described herein, a controller can implement traffic control features, for example, to put a machine into a power saving or off mode (e.g., for UV or other energy consuming units). Such a controller may operate according to an industry signaling standard.

Figure 2:
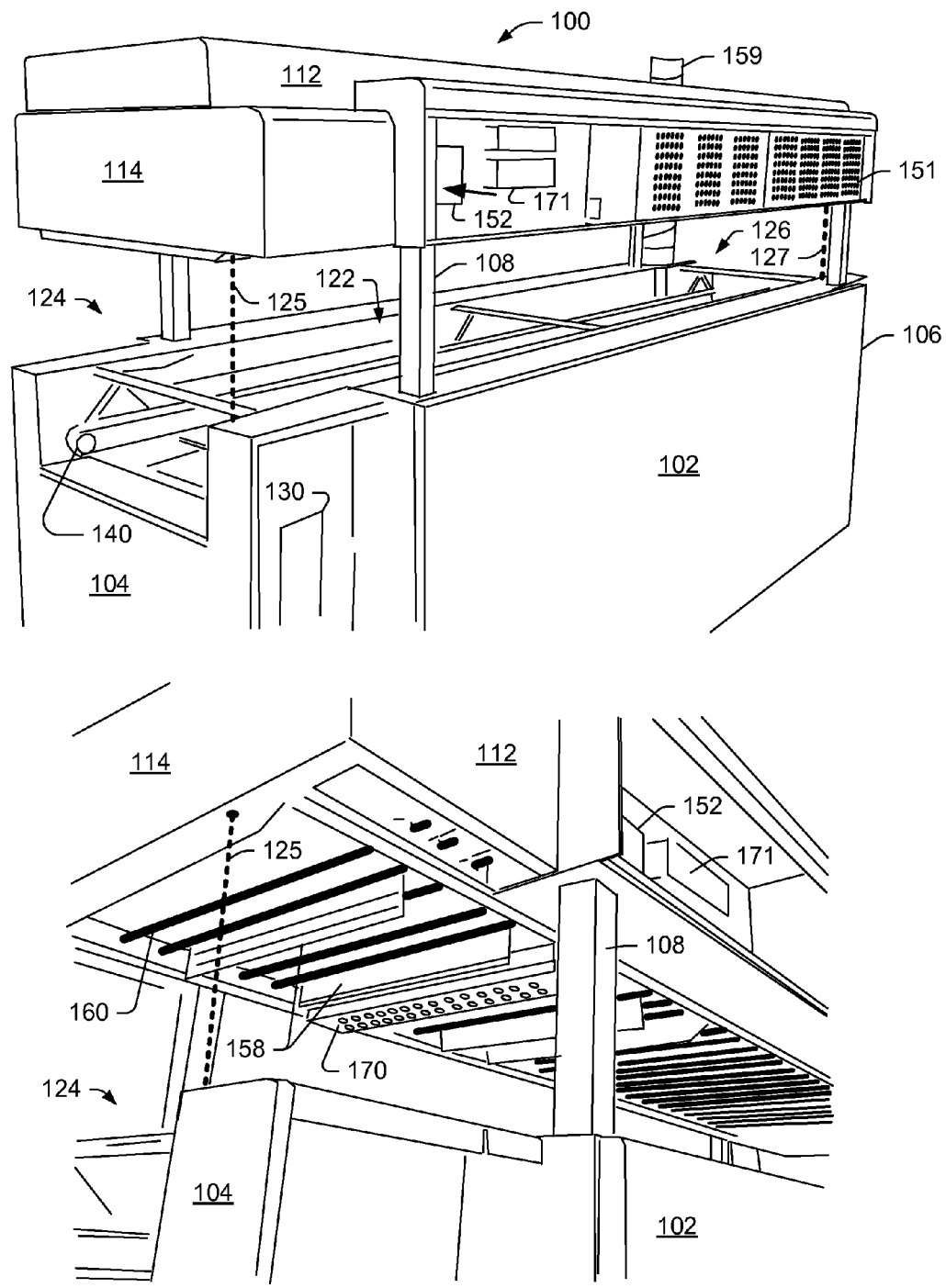
FIG. 2 is a series of perspective views of the machine of FIG. 1.

FIG. 2 shows a perspective view of the machine 100 with the one or more filters 113 (e.g., side filters) removed to expose a series of supports 151 and a gas inlet 152. Further, power supplies 171 are shown as being mounted on the top 112 for supplying power to one or more of the radiation sources 170. In another perspective view, the machine 100 is shown as including vents or gas knives 158, IR emitters as heat sources 160 as well as a bank of radiation emitters 170 that emit at least some UV radiation. The heat sources 160 may be constructed from quartz and have a cylindrical shape (e.g., quartz rods).

In general, during an operation to process coatings, the cover 112 is lowered to cover the product path, as defined by the conveyor path 140. Various reasons may exist for lowering a cover including diminishing leakage of radiation (e.g., IR, UV, etc.), diminishing leakage of gas, optimizing convection (e.g., velocity, flow rate at substrate, etc.), optimizing UV radiation dosage, optimizing operation of a unit (e.g., UV LED unit), etc. Product entering the machine 100 via the input end 104 (e.g., as received by the conveyor) travels in a pre-UV radiation heat zone that includes heat sources 160 and gas knives 158. The gas knives in the pre-UV radiation zone may be disposed at an angle to entrain some environmental gas (e.g., air) from a product input opening defined at least in part by the input end 114 of the cover 112 and the input end 104 of the base 102. In general, the amount of entrained environmental gas, if any, will be less than the amount of gas drawn by the mover 150. In a particular example, the machine 100 may be configured to move gas such as air at about 200 CFM.

As described herein, gas moving in the machine 100 can serve a variety of purposes. Such purposes may relate to cooling one or more components of the machine 100 as well as cooling or heating product traveling along a product path. Gas may further act to carry moisture, solvents, other volatile material or debris. Where gas carries material, the filter 155, if present, may act to filter out such material. As mentioned, a cooling zone may direct gas to the product path where the gas does not pass through a filter (e.g., as a significant amount of solvent may have evaporated in prior zones). Such cooling gas may be optionally directed in a manner where the gas does not pass a moisture source to become humidified. For example, in the example of FIG. 1, the mover 150 may be in a chamber where some of the gas pressurized by the mover 150 may be directed to a cooling zone (e.g., through one or more vents or knives).

The machine 100 may be operated to process a solvent-based coating where by the time the product reaches a cooling zone there is no off-gassing or insignificant off-gassing that could contaminate the cooling gas. In such an example, the heated zones of the process cavity have a single pass gas flow arrangement where the heated process cavity air is exhausted through a filter cavity that may consist of pre-filter, gas phase filtration, post-filter and finally MIRV10. Optionally, such an arrangement may be configured with greater filtration of exhausted gas (e.g., including HEPA filtration).

In the machine 100, gas flow through the heated process cavity zones may be about 200 CFM where a small portion of the gas may enter the process cavity at the entrance 124. Gas flow may be dependent or determined based on one or more exhaust controller settings. Where a machine is configured for processing of solvent-based coatings, a controller may set a minimum gas flow of about 150 CFM to ensure safe LEL levels. For example, for processing solvent-based coatings (e.g., 70% solvents) with a 30 mil thickness on a 20"×20" board, that is double side coated, with a gas flow of at least 150 CFM, exhaust gas would not reach a 25% LEL (Limit Explosive Level).

In the example of FIGS. 1 and 2, the machine 100 is configured to move gas in a manner that cools radiation sources 170 via gas flow and optionally in a manner that carries moisture to the product path. For example, regarding moisture, the moisture sources 180 may be spray nozzles that atomize water downstream from the mover 150, which may be a compressor or fan.

In the example of FIG. 2, the machine 100 is shown as including a fore sensor beam 125 and an aft sensor beam 127, which may be optional or otherwise positioned (e.g., to detect product at the input end and to detect product at the output end). The sensor beam 125, the sensor beam 127 or both may be used for any of a variety of purposes. As described herein, one or more sensors may provide information to a power saving module that acts to save power. For example, if no product is on the product path, then the radiation sources 170 may be adjusted to a low power or off state. In instances where the radiation sources 170 include LEDs, current may be controlled to power off the LEDs, which may prolong longevity, conserve power and reduce potential exposure of one or more operators to radiation emitted from the LEDs.

Figure 3:
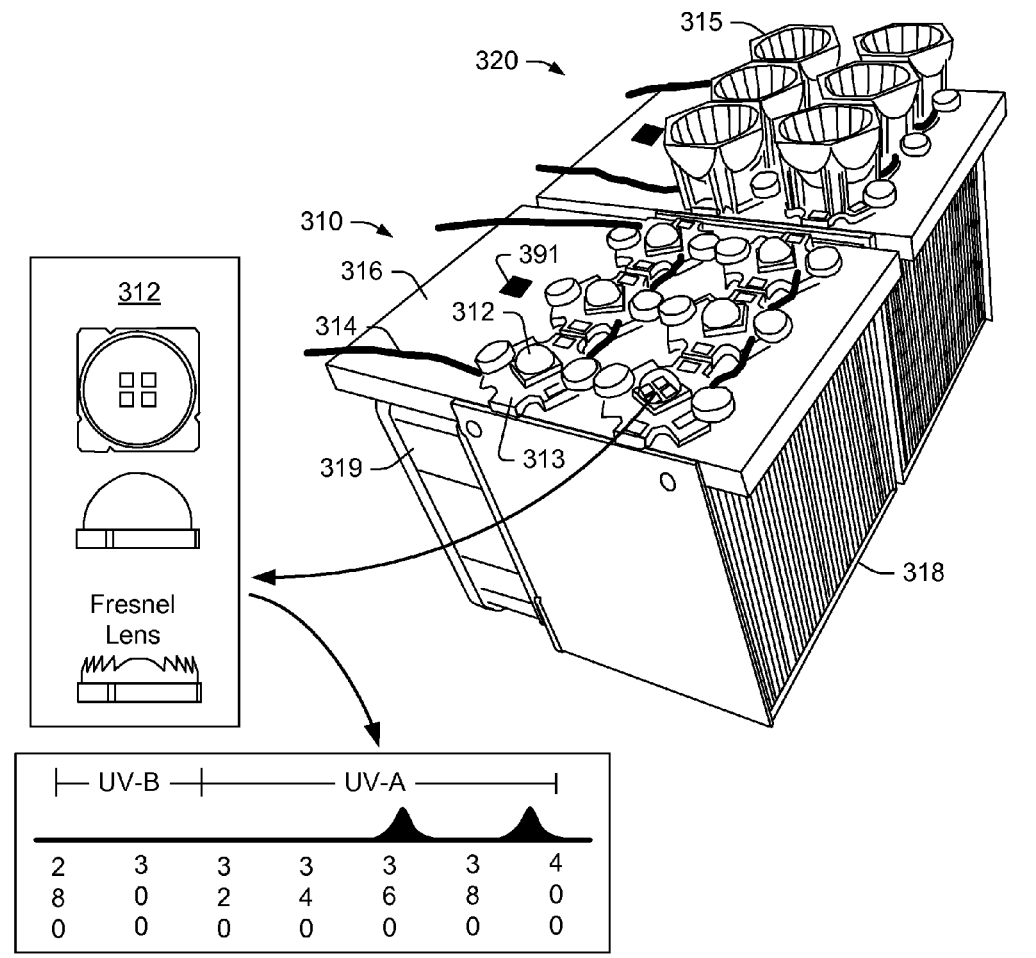
FIG. 3 is a series of perspective views of various components associated with an example of an assembly configured to emit radiation at least in one or more ultraviolet wavelengths.

As described herein, LED-based radiation sources emit at least some UV radiation. FIG. 3 shows a radiation unit 300 that includes a particular arrangement of LEDs that emit UV-A radiation. A subunit of the radiation unit 300 is shown in various stages of assembly. In stage 310, the subunit includes an array of LEDs 312 set on a package 313 with a power feed 314 (e.g., current feed) where the package 313 is fitted to a base plate 316. The base plate 316 acts to conduct heat generated during operation of the LEDs 312. Heat carried by the base plate 316 is transferred to a set of fins 318 or, more generally, a heat sink. In the example of FIG. 3, a fan 319 acts to move fluid across the fins 318. In such a manner, a high-density of LEDs can be mounted and cooled. In the example of FIG. 3, a temperature sensor 391 may be mounted to the unit 300.

As described herein, temperature regulation of LEDs can be quite relevant. An LED configured to emit UV-A radiation can have an upward shift in wavelength with respect to temperature. For example, at 25 C, the peak wavelength may be 395 nm while at 100 C the peak wavelength may shift to 400 nm. As many UV curable coatings cure more effectively at shorter UV-A wavelengths, a shift or unsteadiness over time can impact coating quality and hence product quality. One goal of temperature control may be shortest wavelength while another goal may be steadiest wavelength. A combination of such goals may also be desirable. As described herein, various configurations aim to achieve at least one of these goals to thereby improve coating quality and ultimately product quality. As mentioned below, in general, LEDs emit less intense UV radiation than a long arc mercury vapor lamp. Accordingly, factors such as temperature can be more critical where LED-based UV radiation is relied on for curing a coating. In other words, for an arc lamp, an issue may be too much UV radiation too quickly; whereas, for an LED-based approach, an issue may be too little UV radiation or too much variation in radiation with respect to time (e.g., for a single product or for multiple products where products are not exposed to same or similar doses of radiation).

With respect to commercially available LEDs, in general, a shorter wavelength LED emits less power for a given current. For example, a 365 nm peak wavelength LED may emit about 130 mW at 700 mA and 175 mW at 1000 mA while a longer peak wavelength LED (e.g., 400 nm) may emit about 550 mW at 700 mA and 700 mW at a 1000 mA. Such LEDs may be packaged four to a package (e.g., four dice), accordingly, at 1000 mA, outputs would be 0.67 W and 2.8 W, respectively for 365 nm and 400 nm. As described herein, a package may include mixed dice (e.g., one or more 365 nm and one or more 400 nm or other combination of dice). Packages or dice may be tailored for a particular coating or cure process. For example, where stress issues need to be minimized, a combination of dice may be provided that cause a coating to cure with reduced stress (e.g., as applied to product that is coated); whereas, where speed is required, a different combination of dice may be appropriate. As described herein, in general, a UV LED emits some heat and typically some visible radiation. As to visible radiation, such emission can at times be helpful as an indicator of leakage of or exposure to UV (e.g., an operator can readily detect visible wavelength emissions from a UV LED and understand that UV accompanies the visible wavelength emissions).

In stage 320, the subunit includes reflectors 315. As shown, each array of LEDs 312 includes four LEDs covered by an optical component such as a lens. The lens may have a fairly wide angle of distribution (e.g., +/−70 degrees) or a Fresnel lens with a smaller angle of distribution. The reflectors 315 act to collimate the radiation emanating from the lens to better direct the radiation to product positioned on a product path.

In stage 330, the subunit includes a cover 332 that includes openings shaped to match the reflectors 315. As shown in FIG. 3, a plurality of the subunits 330 are positioned with respect to a plate 302 of the radiation unit 300. The radiation unit 300 may further include one or more reflector walls 303 to further direct radiation toward product and to reduce stray emission of radiation, which could potentially be undesirable.

In the example of FIG. 3, the LEDs 312 are shown as, for example, being configured to emit a shorter wavelength range of UV radiation, a longer wavelength range of UV radiation or a combination of both shorter and longer wavelength ranges. For example, the shorter wavelength range may be centered around about 365 nm while the longer wavelength range may be centered around about 395 nm. Depending on coating applied and optionally other conditions, one range or multiple ranges may be desired to achieve curing and a suitable hardened coating with suitable adhesion to coated substrate.

As described herein, a LED UV system may include various components to enhance delivery of radiation to a product (e.g., primary optics, secondary optics, reflectors, etc.). In a particular example, a LED UV system includes one or more Fresnel lenses to collimate radiation and reduce the FWHM (full width at half maximum) angle (e.g., from about 115 degrees to about 15 degrees). Such a system can shorten a UV zone length in direction of product travel by increasing intensity of UV reaching conveyed product. As described herein, reflectors may be made of polished metal (e.g., 430 stainless steel) or other material (e.g., coated glass, etc.). Reflectors may provide various benefits. For example, a double sided reflector may reflect IR radiation away from a UV zone (e.g., to avoid additional heating of one or more UV radiation units) while reflecting UV radiation toward a coated substrate in the UV zone. Such an approach can optionally be employed to enhance temperature control for adjacent zones. As described herein, a machine may be configured to expose one or more sides of a product (or product components) to UV radiation via optical components, reflectors, positioning of emitters, etc. Emitters may optionally be positioned below a product path, for example, along a side at an angle (e.g., to avoid drippings).

Figure 4:
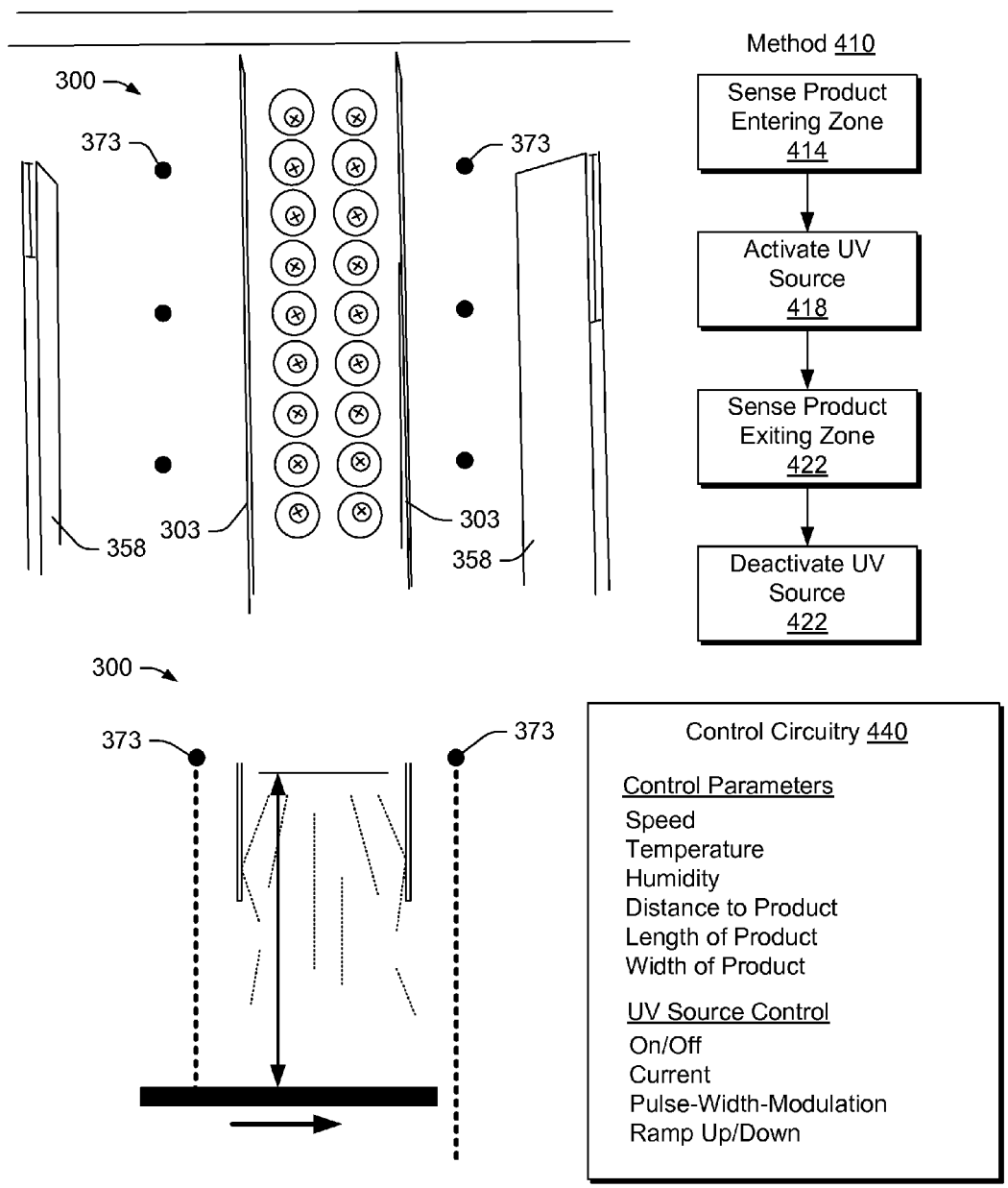
FIG. 4 is a series of views of an example of an assembly installed in a machine to process coatings along with a block diagram of a method and control circuitry.

FIG. 4 shows additional views of the radiation unit 300 with respect to a fore vent and an aft vent 358 and to a fore reflector and an aft reflector 303. Further, a block diagram of a method 410 is shown along with control circuitry 440. In the example of FIG. 4, the radiation unit 300 may include three subunits where each subunit has six LED arrays such as the LED array 312 and one or more product detectors 373 may exist to detect product entering, exiting or entering and exiting a LED zone.

In the example of FIG. 4, the method 410 includes a sense block 414 to sense a product entering a LED zone. An activation block 418 may rely on a signal or command issued by the sense block 414 to activate or otherwise control a LED-based UV source. Another sense block 422, which may be optional, senses product exiting zone (e.g., lead edge, trailing edge, etc.). A deactivation block 422 may rely on a signal or command issued by the sense block 422 (or 414) to deactivate or otherwise control a LED-based UV source. For example, where the length of the product is know and the product conveyor speed (or speed profile), the fore detectors may be sufficient to adequately control the LED-based UV source. In such an example, a detector or detectors may be located a distance in front of the UV zone (e.g., about an inch to a few inches or more) and conveyor information and product information relied on to implement a timer (e.g., optionally via software instructions) to determine when a product has passed the UV zone. According to the foregoing example, one or more UV sources may be de-energized to conserve energy, diminish UV exposure risk and optionally prolong UV source life. Upon detection of an approaching product, the one or more UV sources may be energized, as appropriate.

In the example of FIG. 4, the control circuitry 440 may include one or more control parameters and one or more control options for controlling one or more UV sources. For example, control options may include on/off control, current-based control, pulse-width-modulation (PWM) control, ramp up/down control, etc. Control may optionally include height control (e.g., between a UV source and a product). The control circuitry 440 may optionally depend on temperature where certain control actions are taken to control temperature of a LED-based UV source. As described herein, a LED-based UV source may include different types of LEDs or LEDs that are operated differently (e.g., consider different current supply). In a particular example, short UV wavelength LEDs are operated differently than longer UV wavelength LEDs to provide appropriate UV exposure, for example, while maintaining temperature to promote LED longevity.

In general, a parameter referred to as UV irradiance (mW/cm$^2$) represents power or intensity of UV energy delivered to a surface per unit area. Another parameter, UV dose (mJ/cm$^2$) represents total energy delivered to a surface per unit area (e.g., for a product or portion thereof that passes under a UV radiation source). In general, dose is inversely proportional to product speed.

Yet another parameter is energy, which is the product of power and time. However, in many instances, low intensity exposure to UV radiation for a long time does not necessarily provide the same cure result as high intensity exposure for a proportionally shorter time due to kinetics of curing reaction(s).

The power output each LED array may be about 2 W with a power consumption of 11 W. A subunit with six LED arrays may be driven by a power source with 2 A at 120 VAC. To drive three subunits, one or more power sources with a total of 6 A at 120 VAC may be provided with conversion circuitry to convert to DC voltage, as appropriate. Power of 5 A at about 48 VDC (240 W) may be sufficient to drive 18 LED arrays where each array is rated at 11 W (e.g., below capacity of 13.3 W per LED array). In the example of FIG. 2, the power sources 171 may be configured to each provide 5 A at about 48 VDC. When compared to a conventional long arc mercury vapor lamp UV radiation source, the power reduction is significant. For example, a conventional long arc mercury vapor lamp may require a power source of 16.5 A at 240 VAC (approx. 4,000 W). A conventional Fusion UV Systems, Inc. (Gaithersburg, Md.) lamp has a length of 6 inches while, in the example of FIG. 3, the assembly 330 has a length of 7.1 inches. A high-powered conventional lamp dissipates significant heat and typically requires high voltage and high amperage, which may require certain types of warnings. For example, in addition to high power consumption, a conventional lamp may present a mercury hazard and UV-B and UV-C hazards and, depending on lamp doping, ozone could be emitted as well which is harmful to humans in large dose. As to UV emissions, output of a conventional lamp is significantly higher than a single LED array, the higher output, especially for stray radiation, may require certain types of warnings. In general, a machine should be safe and not overly posted with warnings. Warnings are associated with risk and management of risk increases costs, which must be accounted for while operating a machine to process coatings.

Figure 5:
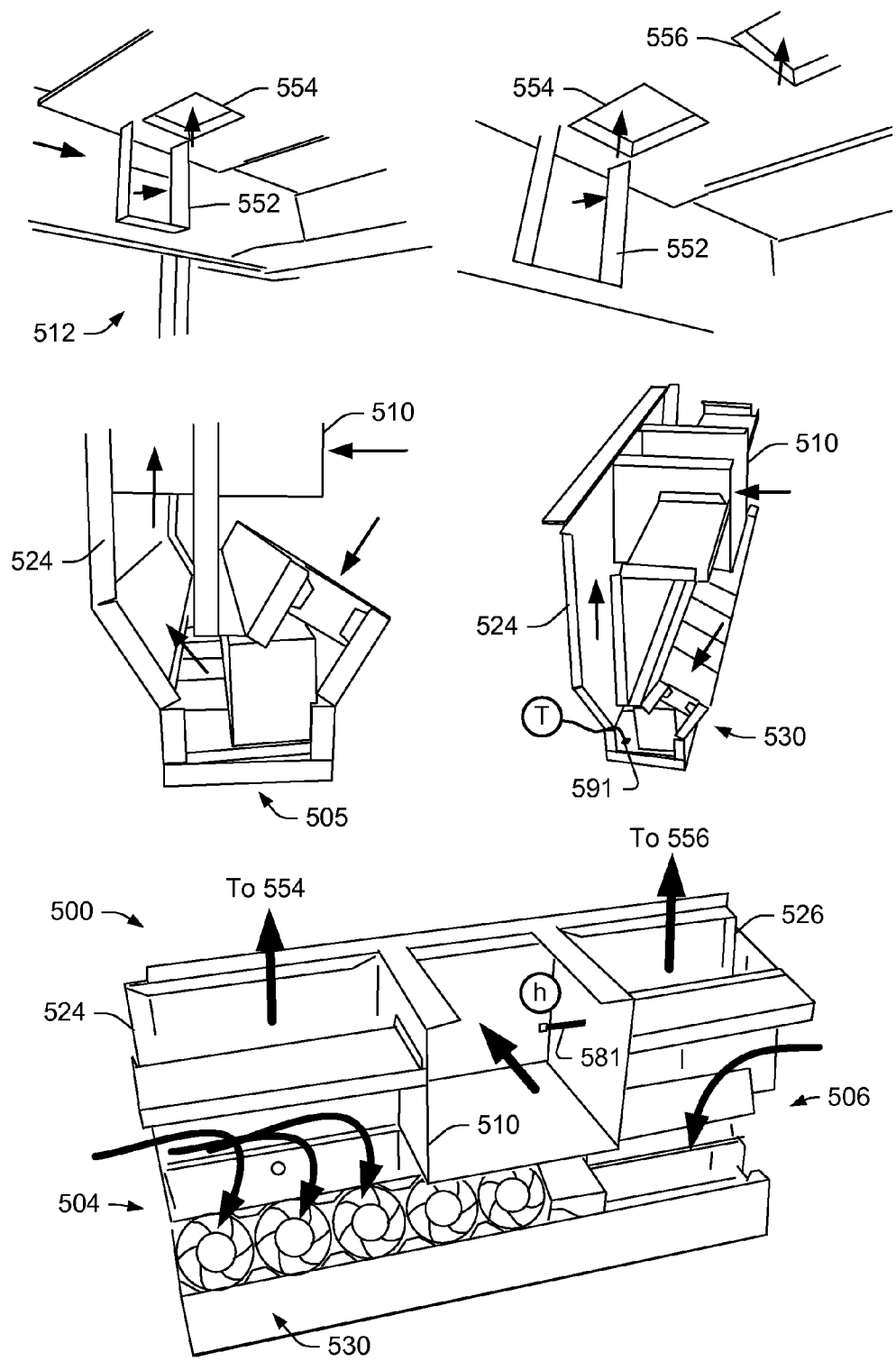
FIG. 5 is a series of perspective views that illustrate an example of an assembly that includes fluid flow paths configured for cooling emitters configured to emit radiation at least in one or more ultraviolet wavelengths.

FIG. 5 shows a series of perspective views of a radiation unit 500 that fits cooperatively with a cover 512 of a machine such as the machine 100 of FIGS. 1 and 2. The radiation unit 500 is fitted with subunits 530. The radiation unit 500 includes two ends 504, 506 and a bottom 505. Radiation is emitted outwardly from the bottom 505. Arrows indicate direction of gas flow (e.g., air flow) with respect to the unit 500 and the cover 512. Gas enters the cover 512 via side openings 552 (other side not shown in FIG. 5). The entering gas is drawn by fans of the subunits 530 downwardly and at an angle to corresponding banks of fins of the subunits 530 (see, e.g., various features of the subunits of FIG. 3). Gas exiting the banks of fins of the subunits 530 travels transversely and then angles upwardly in a boxed passage 524, which is shown as being open in various views for purposes of illustration. The gas exits the boxed passage 524 and enters an opening 554 to an upper gas flow path in the cover 512.

While a full length of subunits are not shown in the example of FIG. 5, a full length of subunits need not be present, for example, depending on the needs and configuration of a machine fitted with the unit 500 (e.g., consider a single conveyor for PCBAs of a width less than the width of the unit 500). In the example of FIG. 5 where subunits do not extend to the end 506, gas can enter the unit 500 from the end 506 and pass via a corresponding boxed passage 526 and to an opening 556 of the cover 512.

Note that the foregoing description does not discuss flow of gas via a boxed passage 510 that is disposed between the passages 524 and 526. In the example of FIG. 5, the passage 510 acts to receive gas pressurized by an upstream mover such as the mover 150 of the example of FIG. 1. The passage 510 is optionally fitted with a dew point sensor 581 to measure dew point of gas passing through the passage 510. For example, referring to FIG. 1, where the moisture sources 180 (or source) provide moisture to the gas moving transversely in the cover 112, the gas is directed through the passage 510, which may be of lesser cross-sectional area than the transverse section upstream the passage 510 and downstream the mover 150. The smaller cross-sectional area of the passage 510 causes the gas to accelerate and mix and thereby provide a more accurate measure of humidity. The dew point sensor 581 may be configured to measure both temperature and humidity to allow for determination of dew point and optionally relative humidity (RH) with respect to temperature. For example, the humidity plenum might contain 80% humidity at about 30 C, which can be input to a control algorithm to determine what the RH would be at 65 C (e.g., dew point being constant).

As described herein, humidity can be a relevant factor in curing of a coating. Accordingly, the unit 500 may be configured to not only include radiation sources but also to include a passage (or passages) that enhance humidity sensing and optionally gas mixing (e.g., to better mix gas and provided moisture).

In the arrangement of FIG. 1, the machine has a zone fore of the radiation sources 170 (e.g., radiation zone). A unit such as the unit 500 can measure humidity of gas that ultimately is directed to product traveling in the fore zone. The sensor 581 (or multiple dew point/humidity sensors) may provide information to a controller (see, e.g., the controller 130 of FIG. 1). As relationships exist between UV dosage and humidity for some types of coatings, a control scheme (or control logic or algorithm) may adjust one or more parameters based on the measured humidity. For example, if humidity is low, conveyor speed may be reduced to expose product to more gas (and hence more moisture) in the fore zone. Alternatively, or in combination therewith, conveyor speed may be selected to adjust dosage of UV radiation. A control scheme may also or alternatively adjust one or more of power of UV radiation (e.g., number of dice), duration of exposure via an on/off mechanism or height between radiation sources and product while product is in a radiation zone defined by the radiation sources 170 (e.g., as provided by the unit 500).

Depending on type of coating, relationships may exist between UV dosage and temperature, UV dosage and humidity, UV dosage and temperature and humidity. For some types of UV curable coatings, secondary moisture cure can proceed to finish curing in shadowed areas of a PCBA, for example, over a course of a day or two.

Various silicone-based coatings specify heat and humidity, for example, a cure profile may specify 60 C with 10% RH. If ambient or room air at 25 C were to be used, this equates to about 75% RH, which is an unpleasant condition for workers. To avoid high humidity working conditions, a machine can be programmed to control humidity in a manner that compensates for lack of ambient humidity. In some instances, a silicone-based coating may specify benefits of secondary humidity after UV; in general, for such coatings, it is not required that humidity and UV exposure occur simultaneously.

As described herein, a machine can include control circuitry to control heating prior to UV exposure. As shown in the example of FIGS. 1 and 2, the machine 100 includes a heat zone positioned upstream from a UV zone. In general, PCBs and PCBAs have a recommended maximum thermal rise rate or thermal acceleration, usually specified in degrees C. per second, where, if exceeded, detrimental stresses (e.g., due to thermal expansion) may occur that could cause strain or other damage. Often, the thermal rise rate depends on PCB/A characteristics (e.g., type of circuit assembly, particular components, etc.). A typically maximum thermal rise rate may be 2 C to about 4 C per second.

As described herein, a control scheme can apply thermal energy within a thermal rise rate limit by adjusting one or more parameters such as wattage, conveyor speed, clearance/height of a heat emitting source to coating material, etc. A safety factor may be employed to reduce risk, for example, a fraction of the maximum thermal rise rate may be relied on to adjust one or more parameters.

While various examples mention a dew point sensor (e.g., the dew point sensor 581), the unit 500 of FIG. 5 is also shown as including at least one temperature sensor 591. For example, each subunit 530 may have a corresponding temperature sensor such as the sensor 591. Where a unit consumes energy, such a unit may be configured with a wattage or other energy sensor. Such sensor or sensors may provide information to a controller (see, e.g., the controller 130 of FIG. 1). In the example of FIGS. 1 and 2, the mover 150 acts to create a negative pressure to draw gas in to the cover 112 via the opening 152 (e.g., and a corresponding opening on the other side of the cover 112). In an instance where the temperature rises at the radiation unit 500, as sensed by the at least one sensor 591, a controller may act to increase speed of the gas mover 150 to draw more gas to the unit 500 and remove more heat from the subunits 530 (e.g., for stability of operation, longevity, etc.). Alternatively, on in combination with the mover 150, fan speed of one or more of the subunits 530 may be increased. In yet another control scheme, radiation power may be decreased while conveyor speed is also decreased to maintain a particular dose of UV radiation to product moving in a radiation zone.

As any change in gas flow through the machine may alter humidity, humidity sensing may be included in a control scheme whereby a control signal acts to control moisture delivered by one or more moisture sources. Additional parameters in a control scheme may include mixture of gas sources. For example, a mixture of environmental air from within a facility may be mixed with environmental air external to the facility (e.g., outside air). In various examples, the term "gas" is used, which may be or include gas other than air (e.g., carbon dioxide, nitrogen or other types of gas that may be used in a coating operation). Carbon dioxide can reduce oxygen inhibition of UV curable coatings; nitrogen could also be used for this purpose but may be more expensive. As described herein, a machine can include an exhaust sensor that provides information for use in one or more control algorithms (e.g., to control humidity, heating, volatiles, etc.).

Figure 6:
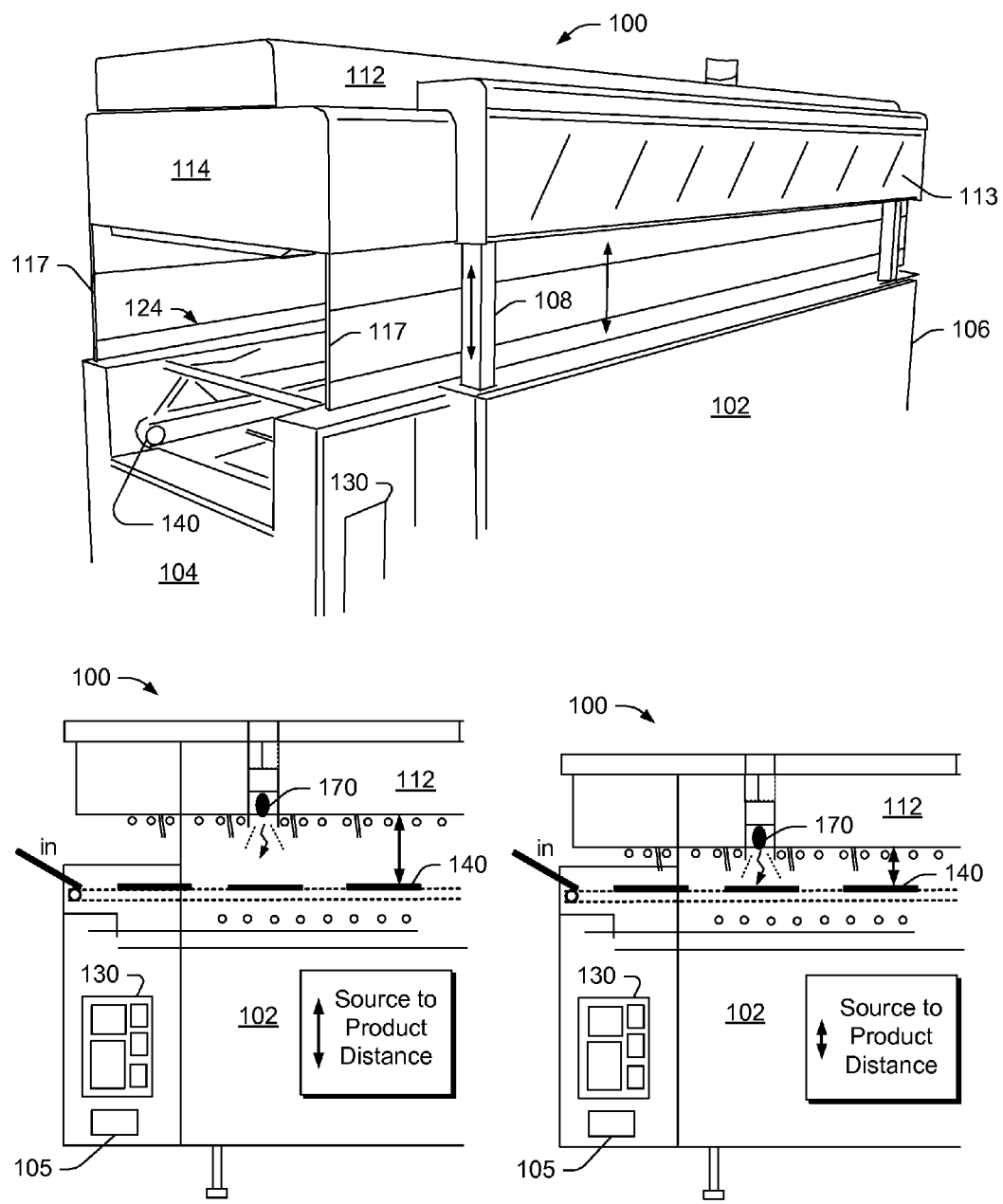
FIG. 6 is a perspective view and schematic side views of a machine with adjustable height features.

FIG. 6 shows a perspective view of the machine 100 as including side covers 117 (e.g., curtains, shutters, etc.) and two schematic side views where the top 112 is positioned at different heights with respect to the base 102 of the machine 100. As described herein, a machine 100 may be configured for source to product distance control. As indicated, the supports 108 may be activated to adjust the height of the top 112 with respect to a product path (e.g., as defined by the conveyor path 140). As shown, the radiation source 170 is brought closer to product moving on the product path, which can act to increase intensity of radiation. Such an approach may allow for faster throughput (e.g., faster conveyor speeds). The curtains or shutters 117 surround the sides of the product path and allow for varying top 112 to base 102 distances. As described herein, a machine optionally allows for setting a height of one or more sources, vents, gas knives, reflectors, etc., whereby adjustment of a cover alters the set height with respect to a product path. For example, an IR radiation source may be adjusted along with a UV radiation source to achieve a desired offset. In such an example, as a cover is raised or lowered, the desired offset can be fixed and remain constant. A control algorithm may optionally include a cover distance profile with respect to a product conveyed along a product path. For example, a control algorithm may call for a lowering of a cover while a product passes a UV radiation zone.

As described herein, the side covers 117 may optionally be controlled to allow for raising or lowering independent of the top 112. Hence, where an operator requires access to the product path (e.g., as defined by the conveyor path 140), depending on the position of the top 112, the operator may input an instruction to raise all side covers 117 or only a side or a portion of thereof to allow for access to the entire product path or a portion of the product path 140. The side covers 117 may be configured with a maximum height whereby raising of the top 112 beyond the maximum height allows for access to the product path 140. In general, the side covers 117 maintain the gas space within the machine 100 such that height may be adjusted without escape of solvent, exposure to stray radiation, etc. As described herein, a conveyor path may include an adjustment mechanism to adjust conveyor path height in a machine, in addition to or alternatively to a cover adjustment mechanism.

As described herein, LED-based UV sources may be adjustable independently of the top 112. For example, a lever mechanism may allow for downward or upward movement of LED-based UV sources with respect to a product path. In FIG. 4, the portion of the unit 300 located between the reflectors 303 may be raised or lowered whereby corresponding heat sinks are likewise raised and lowered to ensure dissipation of heat from the LEDs. As shown in FIG. 3, fans 319 may be mounted to the heat sinks 318 such that up or down movement of LEDs, heat sinks and fans occur simultaneously. As described herein, a machine can include an adjustable LED-based UV unit where the unit includes one or more fans and one or more heat sinks. Such a machine may include control circuitry to control movement of the adjustable LED-based UV unit, for example, to increase emission intensity with respect to a product positioned on a product path of the machine.

In a particular example, a machine includes an adjustable UV radiation unit that can lower one or more UV sources from about 7 inches above the conveyor to about 4 inches above a conveyor (e.g., 3.5 inch clearance below a reflector). Clearance may be determined in one or more manners, for example, by one or more height sensors that sense height of a product being conveyed (e.g., consider an array of cross-path horizontal sensors mounted in a base or a cover of a machine) or by input of one or more product parameters (e.g., to a controller).

Figure 7:
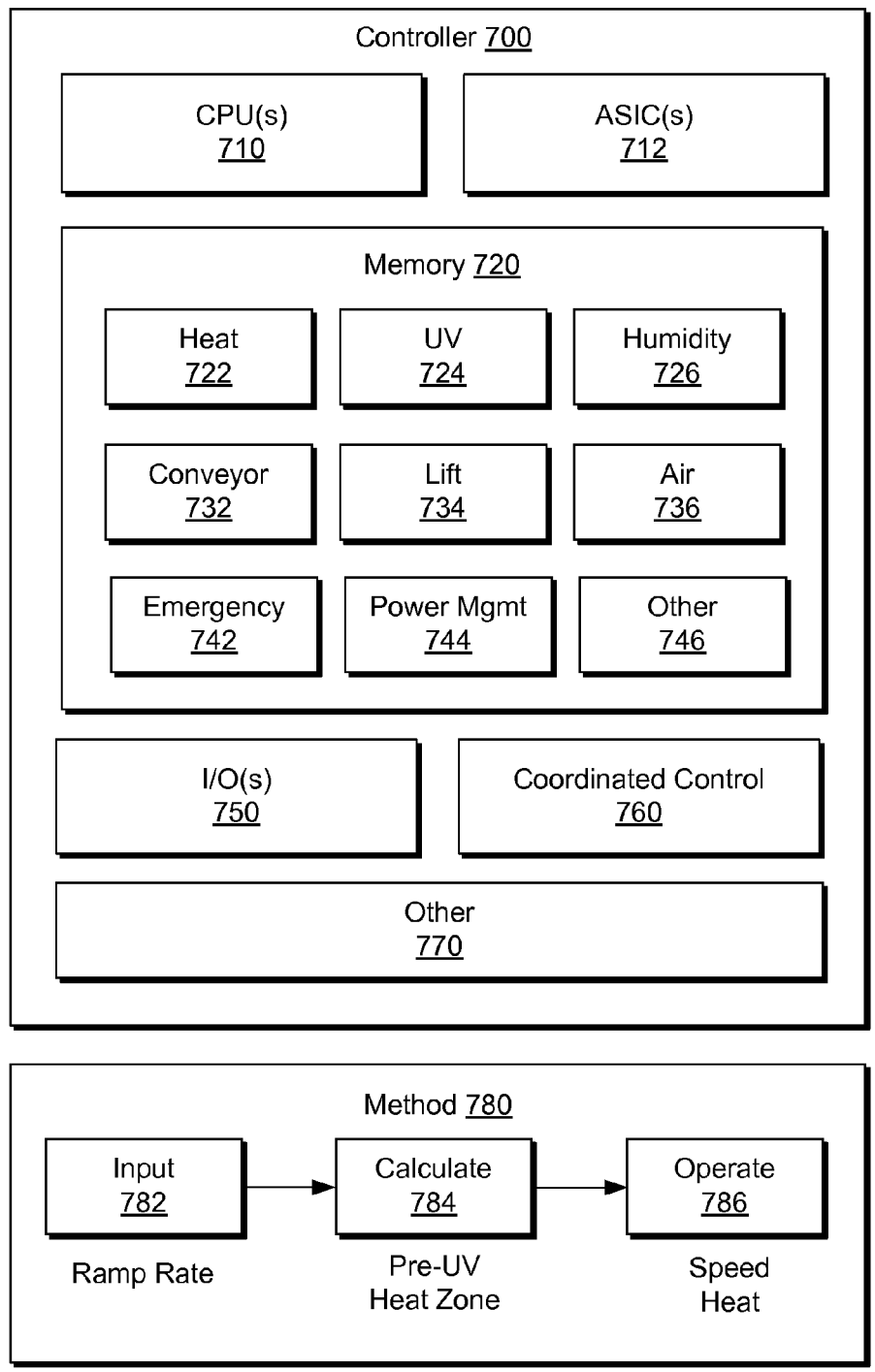
FIG. 7 is a block diagram of an example of a computing unit configured for controlling various processes of a machine to process coatings.

FIG. 7 shows an example of a controller 700, which may be suitably implemented as the controller 130 of the example of FIG. 1, and an example of a method 780. The controller 700 may be a component physically attached to a machine to process coatings or it may be separate and in communication with such a machine (e.g., via wire or wirelessly (e.g., WiFi, Bluetooth®, etc.)). Such a controller 700 may be configured to control more than one machine and may provide for coordinated control, for example, where a change in one or more conditions occurs at one machine and the information is propagated to control schemes for one or more other machines or where a global condition changes and the information is relied on to adjust control schemes at one or more machines. In some instances, machines may be oriented sequentially where control at one machine depends on one or more conditions at a preceding machine. The controller 700 may be configured to provide control for one or more of the foregoing scenarios or optionally one or more other scenarios.

In the example of FIG. 7, the controller 700 is shown as including one or more processors or CPUs 710 (e.g., single core or multi-core), one or more ASICs 712 (which may be optional), memory 720, one or more I/Os 750, a coordinated control module 760 (which may be optional) and one or more other components or modules 770.

In the example of FIG. 7, the memory 720 is shown as including one or more blocks, which may be provided as instructions to instruct the one or more processors 710 or other circuitry. The blocks include a heat block 722, a UV block 724, a humidity block 726, a conveyor block 732, a lift block 734, an air or gas block 736, an emergency block 742, a power management block 744 and optionally one or more other blocks 746; noting that some of the blocks may be optional.

The method 780 of FIG. 7 includes an input block 782 to receive input data such as product characteristics (e.g., thermal mass, thermal rise rate, size, etc.), coating material characteristics (e.g., primary cure, secondary cure, etc.), ambient conditions, etc. A calculation block 784 includes calculating appropriate process conditions based at least in part on the received input. An operation block 786 includes operating a machine to process a coated product. The method 780 may be implemented to determine heating parameters for a heat zone (or zones) prior to a UV zone. For example, for a maximum thermal rise rate of 2 C per second (e.g., accounting for thermal mass, etc.) and a target UV zone temperature of 65 C and an ambient temperature of 25 C, the calculation block 784 may calculate a conveyor speed and a pre-UV zone, heat zone temperature that ensure that a coated product experiences heating less than the maximum thermal rise rate (e.g., 2 C per second) yet reaches a target temperature (e.g., 65 C) prior to passing into a UV zone.

For coating materials that benefit from secondary heat cure, a controller may rely information as to a pre-UV zone, heat zone process and optionally information as to a UV zone process in determining a heating process parameters in one or more post-UV zones.

As described herein, a controller may control a pre-UV zone, heat zone to achieve a particular slope (e.g., 0, positive or negative) of coated product temperature. Such control may include conveyor speed control, wattage, clearance or height between a heat source (or sources) and a coated product.

As described herein, a zone temperature may refer to a product temperature (e.g., a coated substrate temperature) or a gas temperature in the zone. Zone temperatures may also be available depending on arrangement of sensors. For example, a non-contact surface temperature sensor (e.g., laser thermometer, etc.) may be used to measure surface temperature of a coated product while a thermocouple is used to measure gas temperature. A control algorithm may be configured to receive information as to one or more temperatures to optimize a process. A non-contact temperature sensor may be configured to compensate for motion, if appropriate, configured to travel with a product conveyed through a machine, or configured to measure temperature for a brief stationary moment of a product on a path (e.g., optionally coordinated with a conveyor control algorithm). A non-contact temperature sensor may optionally be aimed at a component or group of components on a product that may be particularly sensitive to temperature. Where such a sensor provide spatial information (e.g., a temperature "image"), such information may be analyzed to enhance control of temperature for one or more components of a product.

As described herein, a machine for processing coatings can include a conveyor configured to receive and convey a circuit assembly treated with a UV curable coating material; a UV zone that includes one or more LED-based UV radiation sources; a heating zone; and a controller configured to control heating of a circuit assembly treated with a UV curable coating material in the heating zone to achieve a target temperature of the treated electronic assembly prior to the UV zone. For the foregoing example of a machine, such a controller may be configured to control heating of a circuit assembly treated with a UV curable coating material in the heating zone based at least in part on a maximum thermal rise rate for the circuit assembly (e.g., as may be determined by one or more components of the assembly). For the foregoing example of a machine, such a controller may be configured to control heating of a circuit assembly treated with a UV curable coating material in the heating zone based at least in part on a recommended temperature for the UV curable coating material. For the foregoing example of a machine, such a controller may be configured to control heating of a circuit assembly treated with a UV curable coating material in the heating zone based at least in part on a maximum thermal rise rate for the circuit assembly and based at least in part on a recommended temperature for the UV curable coating material. For the foregoing example of a machine, the controller may be configured to control distance between the one or more LED-based UV radiation sources and the conveyor. For the foregoing example of a machine, the controller may be configured to control depth of penetration of UV radiation with respect to a UV curable coating material in the UV zone by control of temperature in the heating zone. For the foregoing example of a machine, the controller may be configured to control surface tackiness of a UV curable coating material by control of temperature in a post-UV heating zone (e.g., where the machine includes multiple heating zones).

In various examples, a machine for processing coatings may include a humidifier configured to humidify at least one zone and optionally a controller configured to control humidity to assist curing of a UV curable coating material. In various examples, a machine for processing coatings may include a cooling zone.

As described herein, a method can include conveying a product treated with a UV curable coating material; exposing the treated product to IR radiation to heat the treated product; emitting UV radiation by supplying current to one or more LED-based UV radiation sources; exposing the treated product to the emitted UV radiation; and exposing the treated product to one or more of IR radiation to promote curing of the UV curable coating material and humidity to promote curing of the UV curable coating material. In the foregoing example of a method, exposing the treated product to the emitted UV radiation can include conveying the treated product below the one or more LED-based UV radiation sources and optionally adjusting a height between the one or more LED-based UV radiation sources and conveyed, treated product. In the foregoing example of a method, exposing the treated product to IR radiation can include exposing to achieve a target temperature for the treated product prior to conveying the treated product below the one or more LED-based UV radiation sources. In the foregoing example of a method, exposing the treated product to IR radiation to heat the treated product may account for a maximum thermal rise rate for the product or account for a maximum thermal rise rate for the product and a target temperature for the UV curable coating material.

As described herein, a method can include displaying a graphical user interface and receiving an instruction via the graphical user interface, the instruction for adjusting one or more of conveying a treated product, exposing a treated product to IR radiation, emitting UV radiation, exposing a treated product to emitted UV radiation, and optionally exposing a treated product to one or more of IR radiation to promote curing of a UV curable coating material and humidity to promote curing of a UV curable coating material.

As described herein, a controller can include one or more processors; memory; and control circuitry configured to control current delivered to one or more LED-based UV radiation sources and configured to control, based at least in part on a maximum thermal rise rate of a circuit assembly, power delivered to at least one heat source for heating the circuit assembly and speed of a conveyor for conveying the circuit assembly. Such a controller may optionally include control circuitry configured to control humidity (e.g., via a dew point sensor input). In the foregoing example of a controller, control circuitry may be configured to control, based at least in part on a target temperature of a UV curable coating material, power delivered to at least one heat source and speed of a conveyor.

Figure 8:
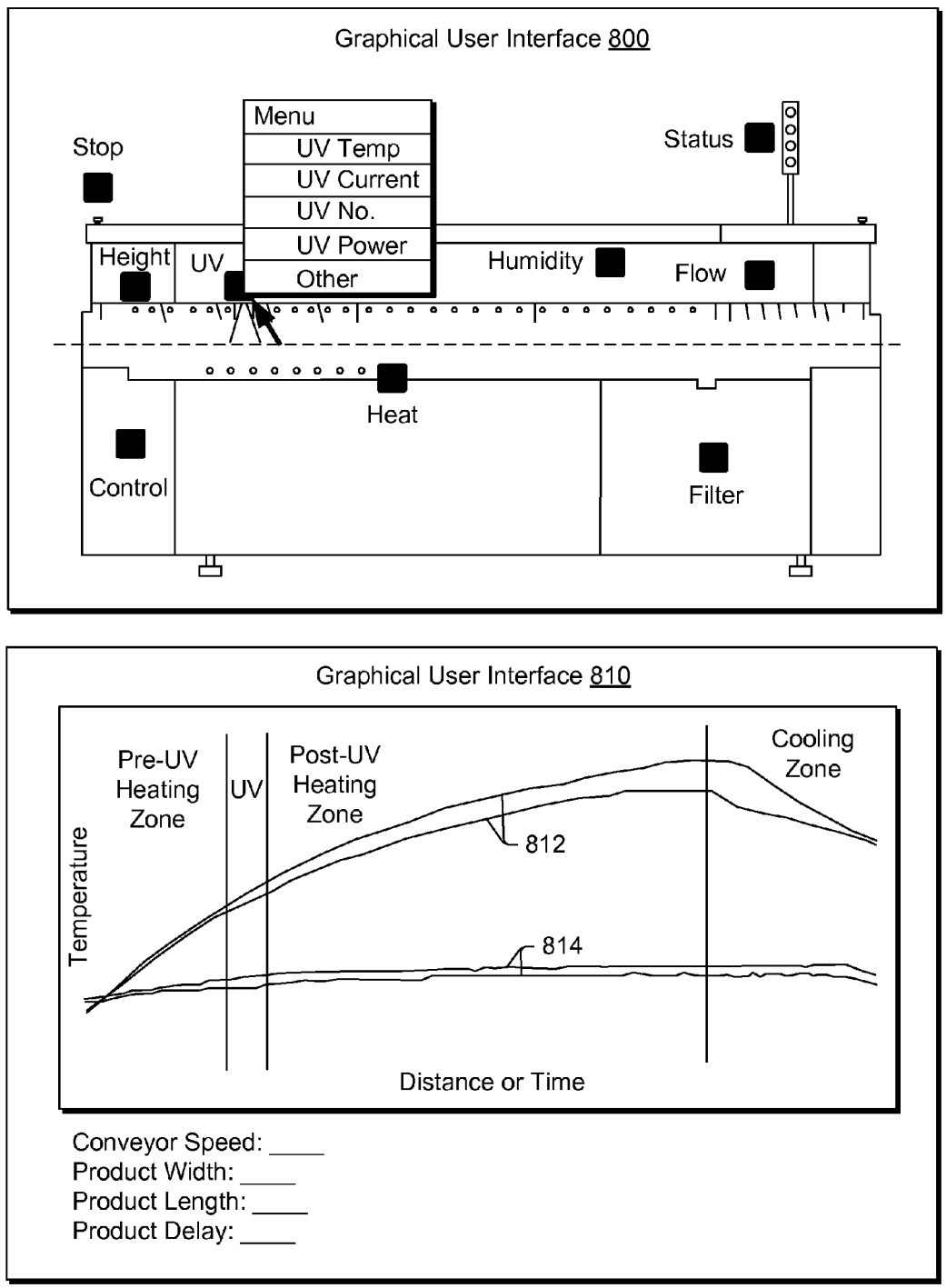
FIG. 8 is a diagram of examples of graphical user interfaces for displaying at least some information about a machine to process coatings.

FIG. 8 shows examples of graphical user interfaces (GUIs) 800 and 810. The GUI 800 presents a diagram of a machine and its various zones and some associated features. The filled squares indicate functional graphics that may be selected or otherwise activated to display one or more options. For example, the UV square may be selected using an input device (e.g., mouse, trackball, joystick, verbal command, etc.). Upon receipt of an activation signal, the GUI 800 may display a menu. In the example of FIG. 8, the menu includes UV temperature, UV current, UV number (e.g., number of sources), UV power and one or more other menu options. Upon selection of an option, the GUI 800 may instruct a computing system (e.g., the controller 130) to display current information, optionally in conjunction with historic information. For example, GUI 810 may be displayed responsive to selection of an option associated with the GUI 800. The GUI 810 shows a plot of temperature versus distance or time for a process for processing coatings (e.g., DYMAX® 9481 coated substrate). In the plot, temperature profiles 812 correspond to substrate moving through a machine such as the machine 100 of FIGS. 1 and 2 and temperature profiles 814 correspond to UV unit temperatures with respect to time. Accordingly, an operator can readily determine whether a coated substrate is achieving one or more target temperatures and optionally whether a UV unit (or units) is being adequately cooled. As described herein, where adjustable height or clearance between a UV source and a coated substrate provides for some heating of a coated substrate (e.g., due to heat emanating from a UV source), temperature information (e.g., profiles 814 or numeric reading) may be useful for adequate control or, in general, process monitoring. The GUI 810 may display conveyor speed, product characteristics and optionally other information. The GUI 810 may allow a user to input information that may be relevant to control of a machine to process coatings.

In the example of FIG. 8, the GUI 810 may display a profile, which may be part of a QC process. The particular GUI 810 shows a UV zone and temperature profiles across the UV zone, which may be tailored for particular coatings. The plot of temperature versus time or position can assist with understanding and controlling UV exposure. In a particular trial, UV exposure occurred between 40 and 50 seconds (10 seconds exposure, 1.3 Joules) after a product entered a machine with a set conveyor speed of 75 cm/min (30 inches per minute). In the trial, after UV exposure, temperature continued to rise as shown in the plot. As mentioned, the particular plot corresponds to curing a DYMAX® 9481 conformal coating at 75 cm/min with good adhesion and tack free surface. The tack free characteristic makes the coated product handle-able immediately upon exiting the machine. The particular coated and processed product reached full cure characteristics within about 2 to 3 days. To achieve full cure in a machine, the residence time would be about 2 to 4 hours, which would be considered economically impracticable for many products. In general, operators care primarily about being able to handle a product without leaving fingerprints or other indentations in the coating, for example, as the product is placed into an anti-static bag prior to shipping.

As described herein, exposure to heat prior to exposure to UV provided a good depth of cure (adhesion to the substrate) while heat after UV exposure promoted good surface cure (tack free). Accordingly, a process can include a pre-UV heating zone, a UV zone and post-UV heating zone where the pre-UV heating zone promotes depth of cure for subsequent exposure to UV radiation and where the post-UV heating zone promotes surface cure after exposure to UV radiation.

As to a pre-UV heating zone, elevation of product temperature can excite photo initiators and, in turn, reduce amount of energy required to achieve cure. Coating manufacturers usually provide a base line curing recommendation (e.g., dose of UV radiation in Joules). For conventional, high-energy lamp-based UV radiation systems, the excess heating that occurs while delivering the recommended dose essentially renders pre-heating concerns to being non-existent or relatively insignificant. Accordingly, as described herein, where UV dose is delivered using a LED-based technique, pre-UV zone heating becomes quite relevant. Hence, in various examples, a machine includes a heating zone prior to a UV zone, for example, to promote depth of cure by subsequent exposure to UV radiation. Again, for comparison, a conventional lamp may generate so much heat that it takes 500 to 1000 CFM blowers to cool the lamp itself. Further, manufacturers of conventional machines configure their machines to direct the lamp cooling air onto product being conveyed to prevent the conveyed product from overheating upon exposure to the high-energy UV source. Yet further, even then, some substrates cannot withstand the heat produced by such conventional high-energy UV lamps. In some conventional systems that rely on one or more high-energy UV lamps, minimum conveyor speed is dictated by the energy output by the one or more lamps. Accordingly, conventional processes can be restricted by use of a conventional high-energy UV lamp.

CONCLUSION

Although various examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. A machine comprising:
    a conveyor that defines a product path disposed in a gas space, the conveyor configured to receive and convey a circuit assembly treated with a UV curable coating material along the product path;
    a UV zone that comprises one or more LED-based UV radiation sources and at least one passage that isolates flow of gas associated with temperature control of the LED-based UV radiation sources from flow of gas to the gas space of the product path;
    a heating zone; and
    a controller configured to control heating of a circuit assembly treated with a UV curable coating material in the heating zone to achieve a target temperature of the treated circuit assembly prior to the UV zone and configured to control a temperature associated with the one or more LED-based UV radiation sources to control wavelength of emitted UV radiation wherein the temperature associated with the one or more LED-based UV radiation sources is less than the target temperature.

2. The machine of claim 1, the controller configured to control distance between the one or more LED-based UV radiation sources and the conveyor.

3. The machine of claim 1, the controller configured to control depth of penetration of UV radiation with respect to a UV curable coating material in the UV zone by control of temperature in the heating zone.

4. The machine of claim 1, the controller configured to control surface tackiness of a UV curable coating material by control of temperature in a post-UV heating zone.

5. The machine of claim 1 further comprising a humidifier configured to humidify at least one zone.

6. The machine of claim 5, the controller configured to control humidity to assist curing of a UV curable coating material.

7. The machine of claim 1 further comprising a cooling zone.

8. A method comprising:
    conveying a product treated with a UV curable coating material along a product path disposed in a gas space;
    exposing the treated product to IR radiation to heat the treated product wherein the exposing comprises exposing to achieve a target temperature for the UV curable coating material prior to conveying the treated product below one or more LED-based UV radiation sources;

emitting UV radiation by supplying current to the one or more LED-based UV radiation sources and controlling a temperature associated with the one or more LED-based UV radiation sources to control wavelength of emitted UV radiation wherein the temperature associated with the one or more LED-based UV radiation sources is less than the target temperature and wherein the controlling the temperature comprises flowing gas in at least one passage that isolates the flow of the gas to the LED-based UV radiation sources from the gas space of the product path;

exposing the treated product to the emitted UV radiation; and further exposing the treated product to one or more of IR radiation to promote curing of the UV curable coating material and humidity to promote curing of the UV curable coating material.

9. The method of claim 8 wherein the exposing the treated product to the emitted UV radiation comprises conveying the treated product below the one or more LED-based UV radiation sources.

10. The method of claim 9 further comprising adjusting a height between the one or more LED-based UV radiation sources and conveyed, treated product.

11. The method of claim 8 further comprising displaying a graphical user interface and receiving an instruction via the graphical user interface, the instruction for adjusting one or more of the conveying, the exposing the treated product to IR radiation, the emitting UV radiation, the exposing the treated product to the emitted UV radiation, and the exposing the treated product to one or more of IR radiation to promote curing of the UV curable coating material and humidity to promote curing of the UV curable coating material.

12. A controller comprising:
one or more processors;
memory; and
control circuitry configured to control current delivered to one or more LED-based UV radiation sources, configured to control, based at least in part on a target temperature of a UV curable coating material, power delivered to at least one heat source and speed of a conveyor wherein the conveyor defines a product path in a gas space, and configured to control a temperature associated with the one or more LED-based UV radiation sources to control wavelength of emitted UV radiation wherein the temperature associated with the one or more LED-based UV radiation sources is less than the target temperature and wherein control of the temperature comprises flowing gas to the one or more LED-based UV radiation sources in at least one passage that isolates the flowing gas from the gas space of the product path.

13. The controller of claim 12, the control circuitry configured to control humidity.

14. The machine of claim 1, the controller configured to control heating of a circuit assembly treated with a UV curable coating material in the heating zone based at least in part on a maximum thermal rise rate for the circuit assembly.

15. The machine of claim 1, the controller configured to control heating of a circuit assembly treated with a UV curable coating material in the heating zone based at least in part on a recommended temperature for the UV curable coating material.

16. The machine of claim 1, the controller configured to control heating of a circuit assembly treated with a UV curable coating material in the heating zone based at least in part on a maximum thermal rise rate for the circuit assembly and based at least in part on a recommended temperature for the UV curable coating material.

17. The method of claim 8 wherein the exposing the treated product to IR radiation to heat the treated product accounts for a maximum thermal rise rate for the product.

18. The method of claim 8 wherein the exposing the treated product to IR radiation to heat the treated product accounts for a maximum thermal rise rate for the product and the target temperature for the UV curable coating material.

19. The controller of claim 12, the control circuitry configured to control, based at least in part on a maximum thermal rise rate of a circuit assembly, power delivered to at least one heat source for heating the circuit assembly and speed of a conveyor for conveying the circuit assembly.

* * * * *